(12) United States Patent
Hayashi (10) Patent No.: US 10,866,456 B2
(45) Date of Patent: Dec. 15, 2020

(54) METHOD OF MANUFACTURING LIGHT EMITTING MODULE AND LIGHT EMITTING MODULE

(71) Applicant: NICHIA CORPORATION, Anan (JP)

(72) Inventor: Tadao Hayashi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 15/898,306

(22) Filed: Feb. 16, 2018

(65) Prior Publication Data

US 2018/0239193 A1 Aug. 23, 2018

(30) Foreign Application Priority Data

Feb. 17, 2017 (JP) .................. 2017-028053

(51) Int. Cl.
*F21V 9/06* (2018.01)
*G02F 1/13357* (2006.01)
*H01L 25/075* (2006.01)
*F21V 9/08* (2018.01)
*G09G 3/36* (2006.01)
(Continued)

(52) U.S. Cl.
CPC .......... *G02F 1/133603* (2013.01); *F21V 9/08* (2013.01); *G02F 1/133605* (2013.01); *G02F 1/133606* (2013.01); *G09G 3/36* (2013.01); *H01L 25/0753* (2013.01); *H01L 33/502* (2013.01); *H01L 33/60* (2013.01); *H01L 33/62* (2013.01); *G02F 1/133617* (2013.01); *G02F 2001/133607* (2013.01); *H01L 33/505* (2013.01)

(58) Field of Classification Search
CPC ......... G02F 1/133603; G02F 1/133605; G02F 1/133606; H01L 33/62; H01L 33/60; H01L 33/502; H01L 25/0753; H01L 33/505; G09G 3/36; F21V 9/08
USPC ........................................... 362/84
See application file for complete search history.

(56) References Cited

U.S. PATENT DOCUMENTS

2007/0019394 A1 1/2007 Park et al.
2008/0101084 A1 5/2008 Hsu
(Continued)

FOREIGN PATENT DOCUMENTS

CN 101256307 A 9/2008
EP 2081079 A2 7/2009
(Continued)

*Primary Examiner* — William J Carter
*Assistant Examiner* — Omar Rojas Cadima
(74) *Attorney, Agent, or Firm* — Hunton Andrews Kurth LLP (57) ABSTRACT

A light emitting module with a reduced thickness is provided.
A method of manufacturing a light emitting module sequentially includes: providing a light guiding plate having a first main surface being a light emitting surface, and a second main surface on the side opposite to the first main surface; providing a plurality of light emitting elements on the light guiding plate; and forming a wiring electrically connecting the plurality of light emitting elements. A light emitting module includes: a light guiding plate having a first main surface and a second main surface; a plurality of wavelength conversion parts disposed at the second main surface of the light guiding plate so as to be spaced apart from each other; a plurality of light emitting elements respectively bonded to the plurality of wavelength conversion parts; and a wiring connected to the plurality of light emitting elements.

10 Claims, 6 Drawing Sheets

(51) Int. Cl.
*H01L 33/50* (2010.01)
*H01L 33/60* (2010.01)
*H01L 33/62* (2010.01)

(56) References Cited

U.S. PATENT DOCUMENTS

| | | | |
|---|---|---|---|
| 2009/0086508 A1* | 4/2009 | Bierhuizen | G02B 6/0018 362/617 |
| 2009/0180282 A1 | 7/2009 | Aylward et al. | |
| 2010/0265694 A1* | 10/2010 | Kim | G02B 6/0021 362/97.1 |
| 2012/0170303 A1* | 7/2012 | Meir | G02B 6/0021 362/555 |
| 2012/0293979 A1 | 11/2012 | Zhang | |
| 2015/0036317 A1 | 2/2015 | Yamamoto et al. | |
| 2015/0287892 A1 | 10/2015 | Han et al. | |
| 2015/0371975 A1 | 12/2015 | Shimizu et al. | |
| 2017/0102127 A1 | 4/2017 | Woodgate et al. | |
| 2018/0366451 A1 | 12/2018 | Shimizu et al. | |

FOREIGN PATENT DOCUMENTS

| | | |
|---|---|---|
| JP | H10-062786 A | 3/1998 |
| JP | 2003242804 A | 8/2003 |
| JP | 2005038776 A | 2/2005 |
| JP | 2005203225 A | 7/2005 |
| JP | 2007042320 A | 2/2007 |
| JP | 2008059786 A | 3/2008 |
| JP | 2010164976 A | 7/2010 |
| JP | 2015032373 A | 2/2015 |
| KR | 20090117419 A | 11/2009 |
| WO | 2005119314 A2 | 12/2005 |
| WO | 2012155365 A1 | 11/2012 |
| WO | 2014122626 A1 | 8/2014 |

\* cited by examiner

METHOD OF MANUFACTURING LIGHT EMITTING MODULE AND LIGHT EMITTING MODULE

CROSS-REFERENCE TO RELATED APPLICATIONS

This application claims priority to Japanese Patent Application No. 2017-028053, filed on Feb. 17, 2017, the disclosure of which is hereby incorporated by reference in its entirety.

BACKGROUND

1. Technical Field

The present disclosure relates to a method of manufacturing a light emitting module, and to a light emitting module.

2. Description of Related Art

The light emitting device using light emitting elements such as light emitting diodes is widely used as any of various types of light sources such as the backlight for a liquid crystal display.

For example, JP 2015-32373 A discloses a light source device including a plurality of light emitting elements mounted on a mount substrate, hemispherical lens members respectively sealing the plurality of light emitting elements, and a diffusing member disposed above the hemispherical lens members and receiving light from the light emitting elements.

However, with the light source device disclosed in JP 2015-32373 A, the distance between the mount substrate and the diffusing plate needs to be greater than the thickness of the lens members, and hence a reduction in thickness may not be fully achieved.

Accordingly, an object of the present disclosure is to provide a light emitting module including a light guiding plate and light emitting elements with which a reduction in thickness is achieved.

SUMMARY

A method of manufacturing a light emitting module of the present disclosure sequentially includes: providing a light guiding plate having a first main surface being a light emitting surface and a second main surface on the side opposite to the first main surface; providing a plurality of light emitting elements on the light guiding plate; and forming a wiring electrically connecting the plurality of light emitting elements.

Further, a light emitting module of the present disclosure includes: a light guiding plate having a first main surface and a second main surface; a plurality of wavelength conversion parts disposed at the second main surface of the light guiding plate so as to be spaced apart from each other; a plurality of light emitting elements respectively bonded to the plurality of wavelength conversion parts; and a wiring connected to the plurality of light emitting elements.

Thus, the present disclosure provides a light emitting module including a light guiding plate and light emitting elements with which a reduction in thickness is achieved.

DETAILED DESCRIPTION OF EMBODIMENTS

In the following, a detailed description will be given of the present disclosure with reference to the drawings. Note that, in the following description, while the terms meaning a specific direction or position (e.g., "upper", "lower", and other terms including those terms) are used as necessary, these terms are for facilitating understanding of the present disclosure with reference to the drawings, and the technical scope of the present disclosure is not limited by the meaning of such terms. Further, those portions denoted by an identical reference character and appearing in a plurality of drawings are an identical or similar part or member.

Further, the embodiment shown in the following is of an exemplary nature for illustrating the light emitting module for embodying the technical idea of the present disclosure, and not intended to limit the present disclosure to the embodiment. Still further, the dimension, material, shape, relative disposition or the like of the constituent components described in the following are of an exemplary nature and not intended to limit the scope of the present disclosure thereto unless otherwise specified. Still further, the contents described in one embodiment or Example is applicable also to other embodiment or Example. Still further, the size, positional relationship and the like of the members shown in the drawings may be exaggerated for the sake of clarity.

Liquid Crystal Display Device 1000

Figure 1:
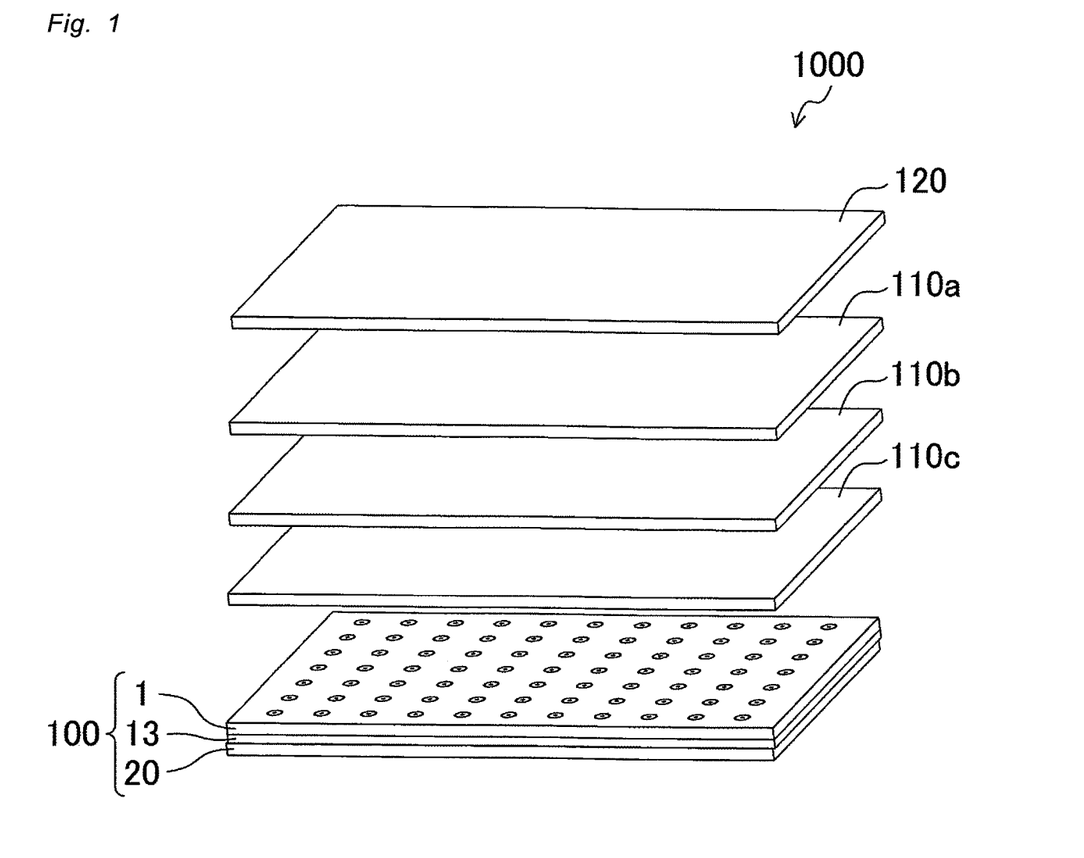
FIG. 1 is a configuration diagram showing the constituent members of a liquid crystal display device according to an embodiment of the present disclosure.

FIG. 1 is a configuration diagram showing the constituent members of a liquid crystal display device 1000 according to an embodiment of the present disclosure. The liquid crystal display device 1000 shown in FIG. 1 includes, sequentially from the upper side, a liquid crystal panel 120, two lens sheets 110a, 110b, a diffusing sheet 110c, and a light emitting module 100. The liquid crystal display device 1000 according to the present embodiment is a so-called direct backlight type liquid crystal device in which the light emitting module 100 is disposed below the liquid crystal panel 120. The liquid crystal display device 1000 irradiates the liquid crystal panel 120 with light emitted by the light emitting module 100. Note that, in addition to the above-described constituent members, members such as a polarizing film, a color filter and the like may be included.

Light Emitting Module 100

Figure 2A:
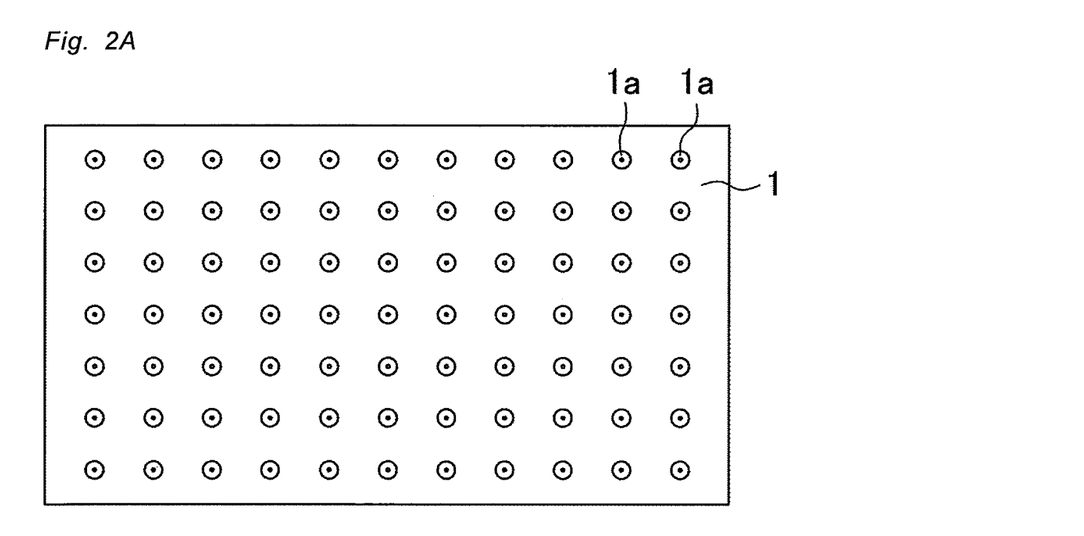
FIG. 2A is a schematic plan view of the light emitting module according to an embodiment of the present disclosure.
Figure 2B:
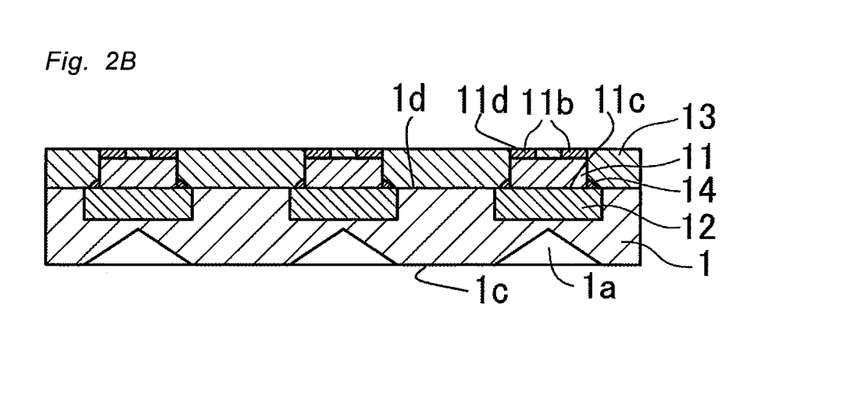
FIG. 2B is a partial enlarged schematic section view of the light emitting module according to an embodiment of the present disclosure.
Figure 2C:
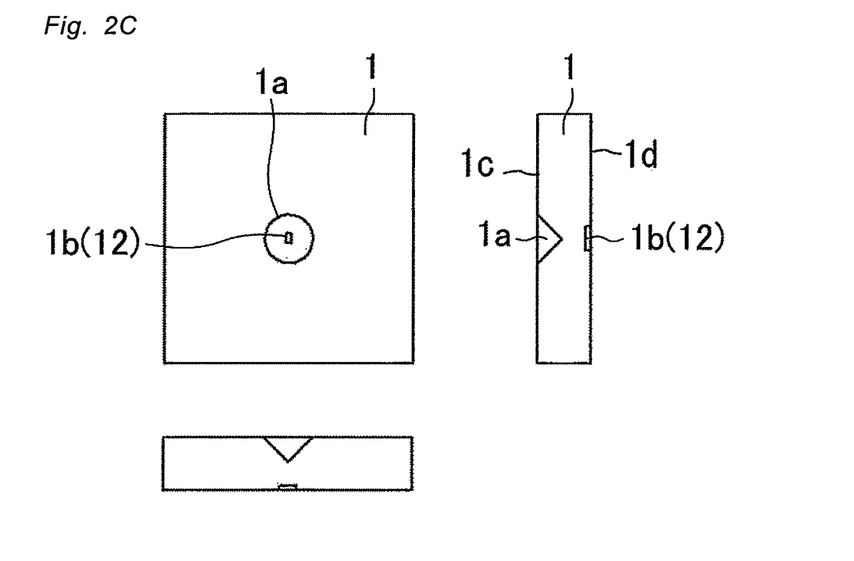
FIG. 2C is a partial enlarged schematic plan view and a partial enlarged schematic section view showing an example of an optical function part and a recess of a light guiding plate according to an embodiment of the present disclosure.

FIGS. 2A to 2C show the structure of the light emitting module according to an embodiment of the present disclosure.

FIG. 2A is a schematic plan view of the light emitting module 100 according to the present embodiment. FIG. 2B is a partial enlarged schematic section view of the light emitting module 100 according to the present embodiment. FIG. 2C is a partial enlarged schematic plan view and a partial enlarged schematic section view showing one example of an optical function part and a recess of a light guiding plate according to the embodiment.

The light emitting module 100 includes a light guiding plate 1, and a plurality of light emitting elements 11 bonded to the light guiding plate 1. The plurality of light emitting elements 11 is arranged in a matrix on the light guiding plate 1. A plurality of recesses 1b are provided at a second main surface 1d of the light guiding plate 1 of the light emitting module 100, in each of which recesses 1b a wavelength conversion material is disposed, to form a plurality of wavelength conversion parts 12 spaced apart from each other. To each of the wavelength conversion parts, one light emitting element 11 is bonded.

By virtue of the light emitting elements being bonded onto the light guiding plate, the light emitting module of the present disclosure achieves a reduction in thickness. Further, by virtue of the light emitting elements being mounted and bonded onto the light guiding plate, as compared to a combination of a substrate equipped with light emitting elements and a light guiding plate, misalignment between the light emitting elements and the light guiding plate is less prone to occur. Thus, the light emitting module having an excellent optical characteristic is obtained. In particular, as will be described later, this structure is particularly preferable in the case where the light guiding plate is provided with optical function parts 1a respectively corresponding to the light emitting elements.

In the direct backlight type liquid crystal device, since the distance between the liquid crystal panel and the light emitting module is small, the luminance unevenness of the light emitting module may influence the luminance unevenness of the liquid crystal display device. Accordingly, a light emitting module with small luminance unevenness is desired as the light emitting module of a direct backlight type liquid crystal device.

With the structure of the light emitting module 100 according to the present embodiment, a reduced thickness of the light emitting module 100 of 5 mm or less, 3 mm or less, 1 mm or less or the like is achieved.

In the following, a detailed description will be given of the members structuring the light emitting module 100 and a method of manufacturing the light emitting module 100 according to the present embodiment.

Light Guiding Plate 1

The light guiding plate 1 is a light-transmissive member that receives light from the light source and emits the light in a planar manner.

The light guiding plate 1 according to the present embodiment includes a first main surface 1c being the light emitting surface, and a second main surface 1d on the side opposite to the first main surface 1c.

To the second main surface 1d of the light guiding plate 1, a plurality of light emitting elements 11 is bonded. This structure reduces the distance between the light guiding plate 1 and the light emitting elements 11, whereby a reduction in thickness of the light emitting module 100 is achieved.

The size of the light guiding plate 1 may fall within a range of, for example, about 1 cm to 200 cm inclusive per side, preferably about 3 cm to 30 cm inclusive per side. The thickness of the light guiding plate 1 may fall within a range of about 0.1 mm to 5 mm inclusive, preferably about 0.5 mm to 3 mm inclusive.

The planar shape of the light guiding plate 1 may be, for example, substantially angular, substantially circular or the like.

As the material of the light guiding plate 1, an optically transparent material may be employed, for example, glass or a resin material such as thermoplastic resin including acrylic, polycarbonate, cyclic polyolefin, polyethylene terephthalate, polyester and the like, or thermosetting resin including epoxy, silicone and the like. In particular, a thermoplastic resin material is preferable for its efficient manufacturability by injection molding. Among others, polycarbonate is preferable for its high transparency and inexpensiveness. The method of manufacturing the light emitting module according to the present embodiment, in which the light emitting elements 11 are mounted on the light guiding plate 1 and thereafter the wiring board is bonded thereto, can dispense with a high-temperature operation such as reflow soldering. Therefore, a thermoplastic and low heat-resistant material such as polycarbonate can also be used.

The light guiding plate 1 can be molded by, for example, injection molding or transfer molding. In the case where the light guiding plate 1 includes the optical function parts 1a and the recesses 1b which will be described later, preferably the light guiding plate 1, the optical function parts 1a, and the recesses 1b are molded collectively with a mold assembly. This also contributes to reducing misalignment of the optical function parts 1a and the recesses 1b in molding.

The light guiding plate 1 according to the present embodiment may be formed as a single layer, or may be made up of a plurality of light-transmissive layers being layered on each other. When a plurality of light-transmissive layers are layered, preferably a layer differing in refractive index, for example, an air layer, is provided between arbitrary ones of the layers. This structure further facilitates diffusion of light, and provides a light emitting module with reduced luminance unevenness. Such a structure can be implemented by, for example, interposing a spacer between arbitrary ones of the plurality of light-transmissive layers so as to separate them from each other, thereby providing an air layer.

Further, a light-transmissive layer may be provided on the first main surface 1c of the light guiding plate 1, and a layer differing in refractive index, e.g., an air layer, may be provided between the first main surface 1c of the light guiding plate 1 and the light-transmissive layer. This structure further facilitates diffusion of light, and provides a liquid crystal display device with reduced luminance unevenness. Such a structure can be implemented by, for example, interposing a spacer between the light guiding plate 1 and the light-transmissive layer so as to separate them from each other, thereby providing an air layer.

Optical Function Parts 1a

The light guiding plate 1 may include the optical function parts 1a on the first main surface side.

The optical function parts 1a may have a function of, for example, spreading light within the plane of the light guiding plate 1. For example, a material differing in refractive index from the material of the light guiding plate 1 is provided. Specifically, each of the optical function parts 1a may be a depression provided on the first main surface 1c side and having a shape such as an inverted cone or an inverted polygonal pyramid including an inverted quadrangular pyramid, an inverted hexagonal pyramid or the like, and reflects the incident light in the lateral direction of each light emitting element 11 at the interface between the material differing in refractive index from the light guiding plate 1 (e.g., air) and the inclined surface of the depression. Further, for example, each of the optical function parts 1a may be a recess having an inclined surface in which a light-reflective material (e.g., a reflective film made of metal or the like, or white-color resin) is provided. The inclined surface of each optical function part 1a may be straight or curved as seen in a section view.

As will be described later, the optical function parts 1a are preferably provided so as to respectively correspond to the light emitting elements 11, that is, provided at the positions on the side opposite to the light emitting elements 11 disposed on the second main surface 1d side. In particular, preferably the optical axis of each light emitting element 11 and the optical axis of corresponding optical function part 1a are substantially identical to each other.

The size of the optical function parts 1a can be set as appropriate.

Positioning Parts, Recesses 1b

The light guiding plate 1 may include the positioning parts 1b on the second main surface 1d side.

Figure 3A:
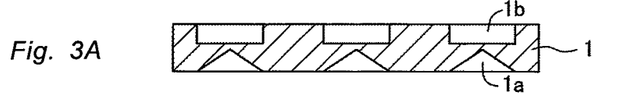
FIGS. 3A to 3I are partial enlarged schematic section views showing exemplary manufacturing operations of the light emitting module according to an embodiment of the present disclosure.

The positioning parts 1b may be in any shape so long as being capable of serving as the reference in mounting the light emitting elements 11. Specifically, each positioning part 1b may be the recess 1b as shown in FIGS. 2B and 3A, a projection, a groove or the like.

The size of each recess 1b as seen in a plan view may fall within a range of, for example, 0.05 mm to 10 mm inclusive, and preferably 0.1 mm to 1 mm inclusive. The depth may fall within a range of 0.05 mm to 4 mm inclusive, and preferably 0.1 mm to 1 mm inclusive. The distance between each optical function part 1a and each recess 1b can be set as appropriate within a range in which the optical function part 1a and the recess 1b are spaced apart from each other.

The shape of each recess as seen in a plan view is, for example, substantially angular, or substantially circular, and can be selected depending on the arrangement pitch of the recesses or the like. In the case where the arrangement pitch of the recesses (the distance between two recesses being closest to each other) is substantially uniform, the shape is preferably substantially circular or substantially square. Among others, with a substantially circular shape, light from the light emitting elements 11 can be spread in an excellent manner.

Diffusing Parts, Wavelength Conversion Parts

The light emitting module according to the present embodiment may include the diffusing parts containing a material that diffuses light from the light emitting elements 11, or the wavelength conversion parts that convert wavelength of light from the light emitting elements 11.

Figure 4:
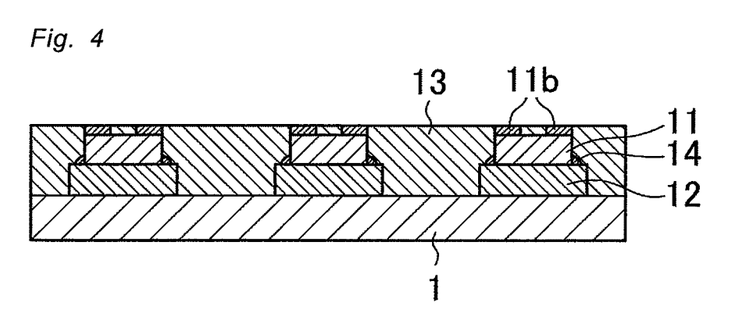
FIG. 4 is a partial enlarged schematic section view of a light emitting module according to an embodiment of the present disclosure.

The diffusing parts or the wavelength conversion parts are provided between the light emitting elements 11 and the light guiding plate 1, and disposed on the second main surface 1d side of the light guiding plate 1. The diffusing parts or the wavelength conversion parts diffuse and evenly distribute the light received from the light emitting elements 11. The diffusing parts or the wavelength conversion parts may be, as shown in FIG. 4, provided on the second main surface 1d of the flat light guiding plate 1 so as to project from the surface of the second main surface 1d. On the other hand, for the purpose of reducing thickness of the light emitting module 100, the diffusing parts or the wavelength conversion parts are preferably provided inside each recess 1b of the light guiding plate 1 as shown in FIG. 2B.

Wavelength Conversion Parts 12

In the present embodiment, the light emitting module 100 preferably includes the wavelength conversion parts 12. Further, the light emitting module 100 preferably includes a plurality of wavelength conversion parts 12 spaced apart from each other. Thus, a reduction in a wavelength conversion material is achieved. Further, the wavelength conversion parts 12 are respectively provided to the light emitting elements 11. Thus, by virtue of the wavelength conversion parts 12 evenly distributing light from the light emitting elements, a reduction in luminance unevenness and color unevenness is achieved.

The wavelength conversion parts 12 can be formed by, for example, potting, printing, spraying or the like. In the case where a wavelength conversion material is disposed inside each of the recesses 1b of the light guiding plate 1 to form the wavelength conversion parts 12, for example, the wavelength conversion material in the liquid state is disposed on the second main surface 1d of the light guiding plate 1, and thereafter the wavelength conversion material is embedded into the plurality of recesses 1b with a squeegee or the like. Thus, the wavelength conversion parts 12 are provided with excellent mass-productivity.

The size or shape of the wavelength conversion parts may be, for example, similar to those of the recesses described above.

Note that, the light guiding plate 1 may undergo processing so as to provide a portion other than the optical function parts 1a with a function of diffusing or reflecting light. For example, when the portion spaced apart from the optical function parts 1a is provided with fine uneven shapes, or rendered to have a rough surface, further diffusion of light is achieved, and consequently a reduction in luminance unevenness is achieved. The wavelength conversion parts 12 may be made of, for example, a base material being a light-transmissive material such as epoxy resin, silicone resin, mixture of epoxy resin and silicone resin, or glass. In view of the light resistance and moldability of the wavelength conversion parts 12, silicone resin is advantageous as the base material of the wavelength conversion parts 12. The base material of the wavelength conversion parts 12 preferably has a higher refractive index than the material of the light guiding plate 1.

The wavelength conversion member contained in the wavelength conversion parts 12 may be a fluoride-based fluorescent material such as a YAG fluorescent material, a β-sialon fluorescent material, a KSF-based fluorescent material or the like. In particular, by a plurality of types of wavelength conversion members being contained in one wavelength conversion part 12, more preferably, by each wavelength conversion part 12 containing a β-sialon fluorescent material emitting light in green color and a fluoride-based fluorescent material such as a KSF-based fluorescent material emitting light in red color, the color reproduction range of the light emitting module increases. In this case, the light emitting elements 11 preferably include a nitride-based semiconductor ($In_xAl_yGa_{1-x-y}N$, $0 \leq X$, $0 \leq Y$, $X+Y \leq 1$) capable of emitting short wavelength light which effectively excites the wavelength conversion member. Further, for example, in order to attain emission of red-color light with the light emitting elements 11 emitting blue-color light, the wavelength conversion parts 12 may contain a KSF-based fluorescent material (a red-color fluorescent material) by 60 wt % or more, preferably 90 wt % or more. That is, the wavelength conversion parts 12 may contain a wavelength conversion member emitting light in a specific color, thereby emitting light in the specific color. Further, the wavelength conversion member may be a quantum dot.

In each wavelength conversion part 12, the wavelength conversion member may be disposed in any manner. For example, the wavelength conversion member may be distributed substantially evenly, or may locally densely exist. Further, a plurality of layers each containing a wavelength conversion member may be layered.

The diffusing part may be, for example, any of the above-described resin materials containing particulates of $SiO_2$ or $TiO_2$.

Light Emitting Elements 11

The light emitting elements 11 are the light source of the light emitting module 100. The plurality of light emitting elements 11 is bonded to one light guiding plate 1.

The light emitting elements 11 each have a main light emitting surface 11c from which mainly emitted light is extracted, an electrode formed surface 11d opposite to the main light emitting surface 11c, and a pair of electrodes 11b formed at the electrode formed surface 11d. The pair of electrodes 11b is disposed so as to oppose to a wiring board 20 which will be described later, and electrically connected to the board wiring of the wiring board 20 as appropriate via a wiring layer 15 or the like. The light emitting elements 11 and the light guiding plate 1 are bonded to each other via a light-transmissive bonding member 14 made of a light-transmissive resin or the like.

The light emitting elements 11 each include, for example, a light-transmissive substrate made of sapphire or the like, and a semiconductor layered structure layered on the light-transmissive substrate. The semiconductor layered structure includes a light emitting layer, and an n-type semiconductor layer and a p-type semiconductor layer between which the light emitting layer is interposed. To the n-type semiconductor layer and the p-type semiconductor layer, an n-side electrode and a p-side electrode 11b are respectively electrically connected. The light emitting elements 11 are each disposed so that the main light emitting surface 11c on the light-transmissive substrate side is disposed opposing to the light guiding plate, and each have a pair of electrodes 11b at the electrode formed surface 11d on the side opposite to the main light emitting surface 11c.

While the longitudinal, lateral, and height dimensions of each light emitting element 11 are not particularly specified, preferably each light emitting element 11 is a semiconductor light emitting element measuring 1000 µm or less longitudinally and laterally as seen in a plan view, further preferably 500 µm or less longitudinally and laterally, and further preferably 200 µm or less longitudinally and laterally. With such light emitting elements, in performing local dimming of a liquid crystal display device, a high-definition image is reproduced. Further, with light emitting elements 11 each measuring 500 µm or less longitudinally and laterally, the light emitting elements 11 are obtained at a lower cost, and hence an inexpensive light emitting module 100 is provided. Note that, a light emitting element measuring 250 µm or less both longitudinally and laterally has a small upper surface area, and therefore the amount of light emitted from the lateral surfaces of the light emitting element becomes relatively great. That is, such a light emitting element tends to emit light in a batwing manner and, therefore, preferably used for a light emitting module 100 according to the present embodiment in which the light emitting elements 11 are bonded to the light guiding plate 1 and the distance between the light emitting elements 11 and the light guiding plate 1 is very short.

Further, preferably the optical function parts 1a having a reflecting or diffusing function such as lenses are provided to the light guiding plate 1, so as to laterally spread light from the light emitting elements 11, and to evenly distribute the light emission intensity within the plane of the light guiding plate 1. However, in the case where a plurality of optical function parts 1a corresponding to a plurality of light emitting elements 11 are formed at the light guiding plate 1, alignment between the light emitting element 11 and the optical function part 1a being small in size may become difficult. Further, misalignment between the light emitting elements 11 and the optical function parts 1a means deviation of the positional relationship between the optical function parts 1a and the light emitting elements 11 from the intended design. In this case, the optical function parts 1a may fail to fully spread light, and luminance may partially reduce within the plane of the light guiding plate 1, that is, unevenness in luminance may be invited.

In particular, as in the conventional method in which, after light emitting elements are mounted on a wiring board, a light guiding plate is combined with the wiring board, misalignment between the wiring board and the light emitting elements and misalignment between the mounted light emitting elements and optical function parts of the light guiding plate need to be taken into consideration in the planar direction and the layered direction. Accordingly, it may become further difficult to optically optimally combine the light emitting elements and the optical function parts to each other.

On the other hand, as to the light emitting module 100 according to the present embodiment, using the plurality of positioning parts (particularly the wavelength conversion parts 12) or the optical function parts 1a previously provided at the light guiding plate 1 as a guide, a plurality of light emitting elements 11 is mounted on the light guiding plate 1. Thus, the light emitting elements 11 can be easily positioned. In this manner, light from the light emitting elements 11 is precisely evenly distributed, so that the light emitting elements 11 serve as an excellent backlight-purpose light source with reduced luminance unevenness or color unevenness.

Further, as described above, preferably the positioning parts 1b being capable of positioning the light emitting elements 11 are provided at positions where the positioning parts 1b correspond to the optical function parts 1a on the surface opposite to the surface where the optical function parts 1a are provided, that is, at positions where the positioning parts 1b overlap with the optical function parts 1a as seen in a plan view in a transparent manner. Among others, by forming the recesses 1b as the positioning parts 1b, and forming a diffusing part inside each of the recesses 1b, which diffusing part is capable of being used for checking the position of the manufacturing device and which is not a member of the light guiding plate 1, more preferably a wavelength conversion part 12, alignment between the light emitting elements 11 and the optical function parts 1a is further facilitated.

Further, by covering the lateral surfaces of each light emitting element 11 with a light-reflecting member (a sealing member 13) so as to limit the light emitting direction; providing the diffusing part or the wavelength conversion part 12 inside the recess 1b opposing to the main light emitting surface 11c of the light emitting element 11; and extracting light mainly from the diffusing part or the wavelength conversion part 12, the diffusing part or the wavelength conversion part 12 capable of diffusing emitted light inside can be regarded as a light emitting part. This structure reduces influence of misalignment of each light emitting element 11 as seen in a plan view which may occur despite its being opposing to the diffusing part or the wavelength conversion part 12.

The light emitting elements 11 are preferably each rectangular as seen in a plan view. In other words, preferably the upper-surface shape of each light emitting element 11 has long sides and short sides. With a high-definition liquid crystal display device, several thousand or more light emitting elements 11 are used, and hence the operation of mounting the light emitting elements 11 is critical. In mounting the light emitting elements 11, when rotational misalignment (e.g., misalignment in a ±90-degree direction) has occurred with part of the plurality of light emitting elements, such rotational misalignment is easily visually recognized with rectangular light emitting elements as seen in a plan view. Further, since a greater distance is secured between the p-type electrode and the n-type electrode, the wiring 15, which will be described later, is easily formed.

On the other hand, with square light emitting elements as seen in a plan view, light emitting elements being small in size are manufactured with excellent mass-productivity.

As to the density (arrangement pitch) of the light emitting elements 11, the distance between the light emitting elements 11 may fall within a range of, for example, about 0.05 mm to 20 mm inclusive, preferably about 1 mm to 10 mm inclusive.

The plurality of light emitting elements 11 is arranged one-dimensionally or two-dimensionally on the light guiding plate 1 as seen in a plan view. Preferably, as shown in FIG. 2A, the plurality of light emitting elements 11 is arranged two-dimensionally along two perpendicular directions, that is, in the x-direction and the y-direction. The arrangement pitch $p_x$ of the plurality of light emitting elements 11 in the x-direction and the arrangement pitch $p_y$ in the y-direction may be identical to each other as shown in FIG. 2A, or may be different from each other. The two arrangement directions may not be perpendicular to each other. Further, the arrangement pitch in the x-direction or the y-direction is not specified to a regular interval, and may be an irregular interval. For example, the light emitting elements 11 may be arranged at an increasing interval from the center toward the periphery of the light guiding plate 1. Note that, the pitch between the light emitting elements 11 refers to the distance between the optical axes of the light emitting elements 11.

The light emitting elements 11 may be any known semiconductor light emitting elements. In the present embodiment, the light emitting elements 11 are exemplarily light emitting diodes. The light emitting elements 11 emit blue-color light, for example. Further, the light emitting elements 11 may be a light source that emits white-color light. Still further, the plurality of light emitting elements 11 may be light emitting elements emitting light in different colors. For example, the light emitting module 100 may include light emitting elements respectively emitting red-color light, blue-color light, and green-color light, so that white-color light is emitted by the red-color light, blue-color light, and green-color light being combined with each other.

As the light emitting elements 11, elements that emit light of arbitrary wavelength can be selected. For example, as the element that emits blue-color light or green-color light, a nitride-based semiconductor ($In_xAl_yGa_{1-x-y}N$, $0 \leq X$, $0 \leq Y$, $X+Y \leq 1$) or a light emitting element using GaP may be employed. Further, as the element that emits red-color light, a light emitting element containing a semiconductor such as GaAlAs, AlInGaP or the like may be employed. Still further, a semiconductor light emitting element made of a material other than the foregoing materials may be employed. Depending on the material and the mixed crystal ratio of the semiconductor layer, any of various light emission wavelengths can be selected. The composition, color of the emitted light, size, the number of the employed light emitting elements should be selected as appropriate according to the intended use.

Light-Transmissive Bonding Member 14

The light emitting elements 11 may be bonded to the light guiding plate 1, the diffusing parts, or the wavelength conversion parts 12 with the light-transmissive bonding member 14. In the present embodiment, the light-transmissive bonding member 14 is provided between the main light emitting surface 11c of each light emitting element and the light guiding plate 1.

The light-transmissive bonding member 14 transmits light from the light emitting elements 11 by 60% or more, preferably 90% or more. The light-transmissive bonding member 14 has a function of propagating the light emitted by the light emitting elements 11 to the light guiding plate 1. Accordingly, while it is possible for the light-transmissive bonding member 14 to contain a diffusing member or the like, the light-transmissive bonding member 14 may be made of solely a light-transmissive resin material not including a diffusing member or the like. The light-transmissive bonding member 14 may cover the lateral surfaces of each light emitting element 11 (the surfaces connecting between the main light emitting surface 11c and the electrode formed surface 11d). Further, preferably the light-transmissive bonding member 14 covers the lateral surfaces of the light emitting layer of each light emitting element 11. Thus, light emitted in the lateral surface directions of each light emitting element 11 is efficiently extracted into the light-transmissive bonding member 14, whereby the light emission efficiency of the light emitting module 100 improves. In the case where the light-transmissive bonding member 14 covers the lateral surfaces of each light emitting element 11, as shown in FIG. 2B, the light-transmissive bonding member 14 is preferably formed so as to spread toward the light guiding plate 1 as seen in a section view. Thus, the light emitted in the lateral surface directions of each light emitting element 11 can be efficiently extracted toward the light guiding plate 1.

In the case where each light emitting element 11 includes a light-transmissive substrate, the light-transmissive bonding member 14 preferably covers at least part of the lateral surfaces of the light-transmissive substrate. Thus, out of the light emitted by the light emitting layer, the light propagating inside the light-transmissive substrate and emitted in the lateral direction is extracted upward. Preferably, the light-transmissive bonding member 14 covers at least half the lateral surfaces of the light-transmissive substrate in the height direction. More preferably, the light-transmissive bonding member 14 is formed so as to be in contact with the sides formed by the lateral surfaces and the electrode formed surface 11d of each light emitting element 11.

Further, the light-transmissive bonding member 14 is preferably specifically disposed within a range inner than the outer edge of each diffusing part or each wavelength conversion part 12 in a plan view as seen from the first main surface 1c side of the light guiding plate 1. Thus, the light from each light emitting element 11 efficiently enters the diffusing part or the wavelength conversion part 12, whereby luminance unevenness or color unevenness in the emitted light reduces.

The material of the light-transmissive bonding member 14 may be a light-transmissive and thermosetting resin material such as epoxy resin, silicone resin or the like.

Sealing Member 13

The sealing member 13 according to the present embodiment seals the lateral surfaces of a plurality of light emitting elements 11, the second main surface 1d of the light guiding plate 1, and the lateral surfaces of the light-transmissive bonding member 14. This structure reinforces the light emitting elements 11 and the light guiding plate 1. Further, forming the sealing member 13 by a light-reflecting member allows light emitted by the light emitting elements 11 to efficiently enter the light guiding plate 1. Further, by the sealing member 13 serving both as a member protecting the light emitting elements 11 and as a reflecting member provided at the surface opposite to the exiting surface of the light guiding plate 1, a reduction in thickness of the light emitting module 100 is achieved.

Note that, as shown in FIG. 4, in the case where each wavelength conversion part 12 is provided on the second main surface of the light guiding plate 1 and the surface of each wavelength conversion part 12 such as the lateral surfaces and the like are exposed outside the light guiding plate 1, preferably such an exposed portion is also covered with the sealing member 13.

The sealing member 13 serving as a reflecting member is preferably a light-reflecting member.

The sealing member 13 serving as a reflecting member has a reflectivity of 60% or more, preferably 90% or more, to light emitted by the light emitting elements 11.

The material of the sealing member 13 serving as a reflecting member is preferably resin containing a white-color pigment or the like. In particular, silicone resin containing titanium oxide is preferable. Thus, by using a large amount of an inexpensive raw material such as titanium oxide as the material used in a relatively large amount for covering one surface of the light guiding plate 1, an inexpensive light emitting module 100 is provided.

Wiring 15

The light emitting module 100 may be provided with the wiring 15 that is electrically connected to the electrodes 11b of each of the plurality of light emitting elements 11. The wiring 15 can be formed on the surface of the sealing member 13 or the like opposite to the light guiding plate 1. By virtue of provision of the wiring 15, for example, electrical connection can be established between the plurality of light emitting elements 11, and any circuit necessary for local dimming of the liquid crystal display device 1000 or the like is easily formed.

Figure 3B:
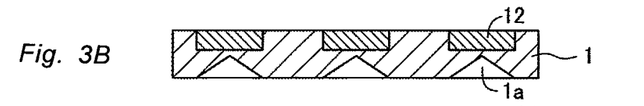
Figure 3C:
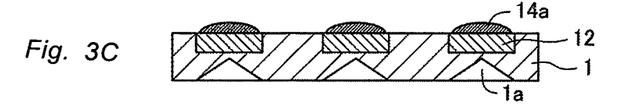
Figure 3D:
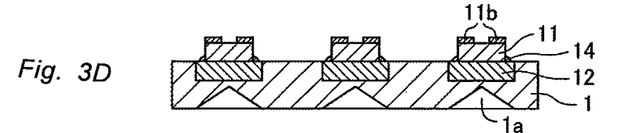
Figure 3E:
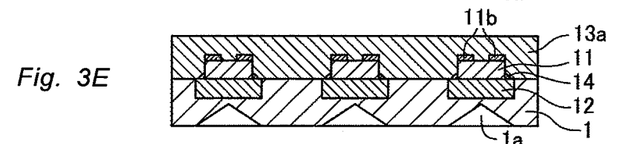
Figure 3F:
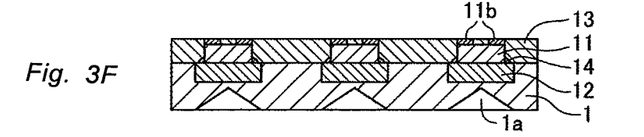
Figure 3G:
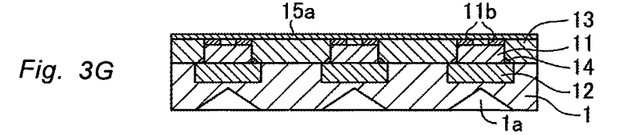
Figure 3H:
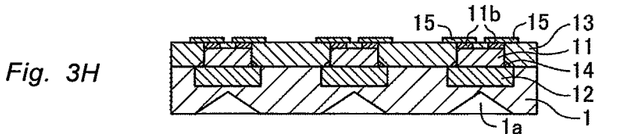

For example, as shown in FIG. 3G to 3H, the wiring 15 can be formed by: exposing the positive and negative electrodes 11b of the light emitting element 11 at the surface of the sealing member 13; forming a metal film 15a on substantially the entire surface of the electrodes 11b of the light emitting element 11 and the sealing member 13; and removing the metal film 15a partially with laser or the like so as to achieve patterning.

Wiring Board 20

Figure 3I:
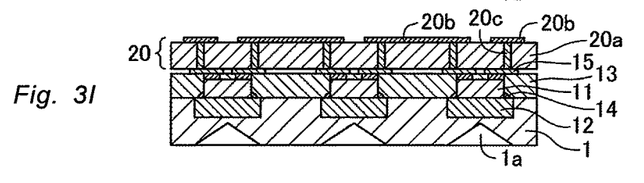

As shown in FIG. 3I, the light emitting module 100 of the present disclosure may have the wiring board 20. Thus, any complicated wiring necessary for local dimming and the like is easily formed. The wiring board 20 may be provided by: mounting the light emitting elements 11 on the light guiding plate 1, and forming the sealing member 13 and the wiring 15 in any manner; and thereafter bonding the wiring board 20 including a wiring layer 20b to the electrodes 11b of each light emitting element and the wiring 15. Further, in providing the wiring 15 connected to the light emitting elements 11, the wiring 15 being greater in shape than the planar shape of the electrodes 11b of the light emitting element 11 facilitates establishing electrical connection between the wiring board 20 and the light emitting elements 11 and the like.

The wiring board 20 is a board including an insulating base member 20a, the wiring layer 20b electrically connected to the plurality of light emitting elements 11 and the like. At the wiring board 20, for example, conductive members 20c with which a plurality of via holes provided at the insulating base member 20a are filled, and the wiring layer 20b electrically connected to the conductive members 20c on both sides of the base member 20a are formed.

The wiring board 20 may be made of any material. For example, ceramic or resin may be used. In view of lower costs and moldability, resin may be selected as the material of the base member 20a. The resin may be phenolic resin, epoxy resin, polyimide resin, BT resin, polyphthalamide (PPA), polyethylene terephthalate (PET), unsaturated polyester, or a composite material such as glass epoxy. Further, the wiring board 20 may be a rigid circuit board or a flexible circuit board. With the light emitting module 100 according to the present embodiment, the positional relationship between the light emitting elements and the light guiding plate is previously determined. Accordingly, despite the wiring board 20 including the base member 20a being made of a material which may warp or expand due to heat or the like, misalignment between the light emitting elements 11 and the light guiding plate 1 is less prone to occur. Hence, a board made of an inexpensive material such as glass epoxy or having a small thickness can be employed as appropriate.

The wiring layer 20b is, for example, conductive foil (a conductive layer) provided on the base member 20a, and electrically connected to the plurality of light emitting elements 11. The material of the wiring layer 20b preferably exhibits high thermal conductivity. Such a material may be, for example, an electrically conductive material such as copper. Further, the wiring layer 20b can be formed by plating, applying electrically conductive paste, printing or the like. The thickness of the wiring layer 20b is, for example, about 5 μm to 50 μm.

The wiring board 20 may be bonded to the light guiding plate 1 and others by any method. For example, the bonding is achieved by: disposing an adhesive sheet between the surface of the sealing member 13 provided on the opposite side of the light guiding plate 1 and the surface of the wiring board 20, and applying pressure. Further, electrical connection between the wiring layer 20b of the wiring board 20 and the light emitting elements 11 may be established by any method. For example, by the conductive members 20c being metal embedded in the via holes being pressurized and heated so as to be molten, the conductive members 20c is bonded to the wiring 15.

Note that, the wiring board 20 may have a layered structure. For example, as the wiring board 20, a metal plate provided with an insulating layer at its surface may be employed. Further, the wiring board 20 may be a TFT board having a plurality of TFTs (Thin-Film Transistors).

FIGS. 3A to 3I show an exemplary method of manufacturing the light emitting module according to the present embodiment.

Firstly, as shown in FIG. 3A, the light guiding plate 1 is provided. The light guiding plate 1 is made of polycarbonate, and includes the inverted cone-shaped optical function parts 1a and the recesses 1b.

Next, onto the second main surface side of the light guiding plate 1, a wavelength conversion material being a mixture of a fluorescent material and silicone resin is applied, and embedded in the plurality of recesses 1b with a squeegee. The superfluous wavelength conversion material not accommodated in the recesses 1b is removed. Then, the wavelength conversion material is cured. Thus, as shown in FIG. 3B, a plurality of wavelength conversion parts 12 spaced from each other are formed.

Next, as shown in FIG. 3C, onto each of the wavelength conversion parts 12, liquid silicone resin being a light-transmissive bonding member material 14a is applied.

Next, as shown in FIG. 3D, onto each of the light-transmissive bonding member materials, the light emitting element 11 having a light-transmissive sapphire substrate is disposed. Here, the light emitting element 11 is formed so that the main light emitting surface 11c being the surface on the sapphire substrate side is oriented to the light guiding plate 1, and the electrode formed surface 11d where the pair of electrodes 11b are formed is oriented opposite to the light guiding plate 1. Further, the light-transmissive bonding member 14 is disposed at particularly the lateral surfaces of the sapphire substrate of the light emitting element 11. Then, the material of the light-transmissive bonding member 14 is cured, whereby the light emitting elements 11 and the light guiding plate 1 are bonded to each other and mounting is realized.

Next, as shown in FIG. 3E, a light-reflective sealing resin material 13a being a mixture of titanium oxide and silicone resin is formed by, for example, transfer molding, so that the second main surface 1d of the light guiding plate 1, the plurality of light emitting elements 11, and the plurality of light-transmissive bonding members 14 are embedded. At this time, the light-reflective sealing resin material 13a is formed to have a great thickness so as to completely cover the upper surface (the surface opposite to the light guiding plate 1) of the electrodes 11b of each light emitting element 11. Next, as shown in FIG. 3F, part of the sealing resin material 13a is ground so as to expose the electrodes of each light emitting element. Thus, the sealing member 13 is formed.

Next, as shown in FIG. 3G, over the substantially the entire surface of the electrodes 11b of the light emitting element 11 and that of the sealing member 13, a metal film 15a made up of Cu/Ni/Au from the light guiding plate 1 side is formed by sputtering or the like. Next, as shown in FIG. 3H, the metal film 15a is patterned by laser abrasion. Thus, the wiring 15 is formed.

Next, as shown in FIG. 3I, the wiring 15 is bonded under pressure to the separately provided wiring layer 20b of the wiring board 20 having an adhesive sheet interposed between them. At this time, by part of the conductive material embedded in part of the wiring layer 20b (e.g., the via holes) being molten by being pressurized and heated, the wiring 15 and the wiring layer 20b are electrically connected to each other.

In this manner, the light emitting module 100 according to the present embodiment is obtained.

The plurality of light emitting elements 11 may be wired so as to be capable of independently driving. Further, the light guiding plate 1 may be divided into a plurality of ranges. A plurality of light emitting elements 11 mounted within one range is regarded as one group. The plurality of light emitting elements 11 belonging to the one group is electrically connected in series or parallel to each other so as to be connected to an identical circuit. A plurality of such light emitting element groups may be provided. This grouping provides a light emitting module with which local dimming is realized.

Figure 5A:
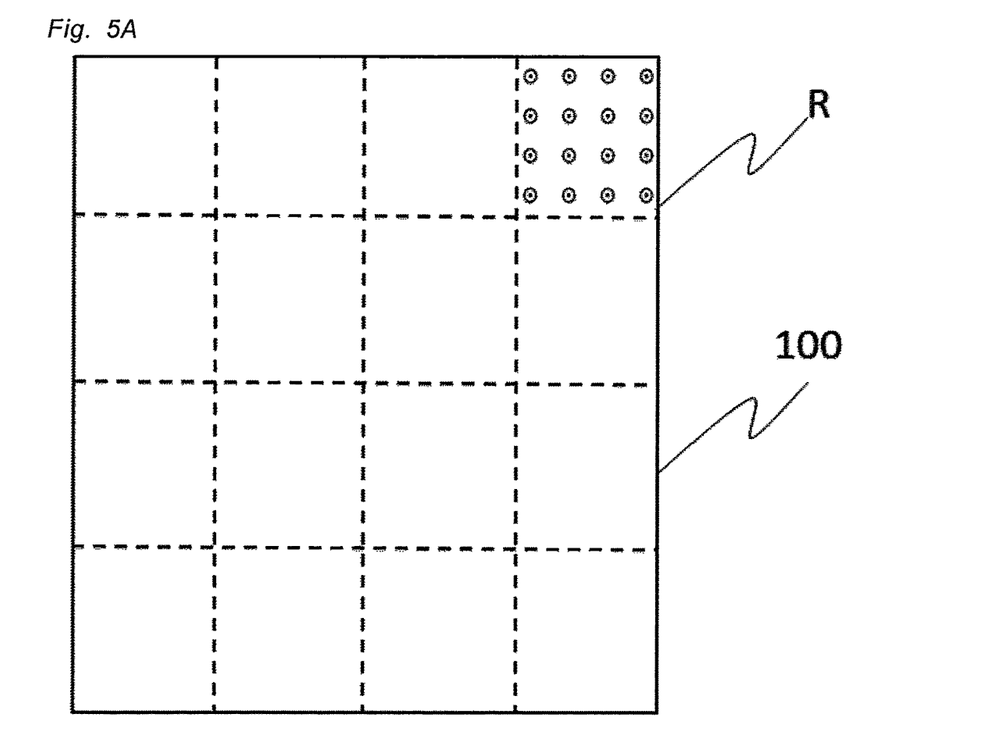
FIG. 5A is a schematic plan view of the light emitting module according to an embodiment of the present disclosure.
Figure 5B:
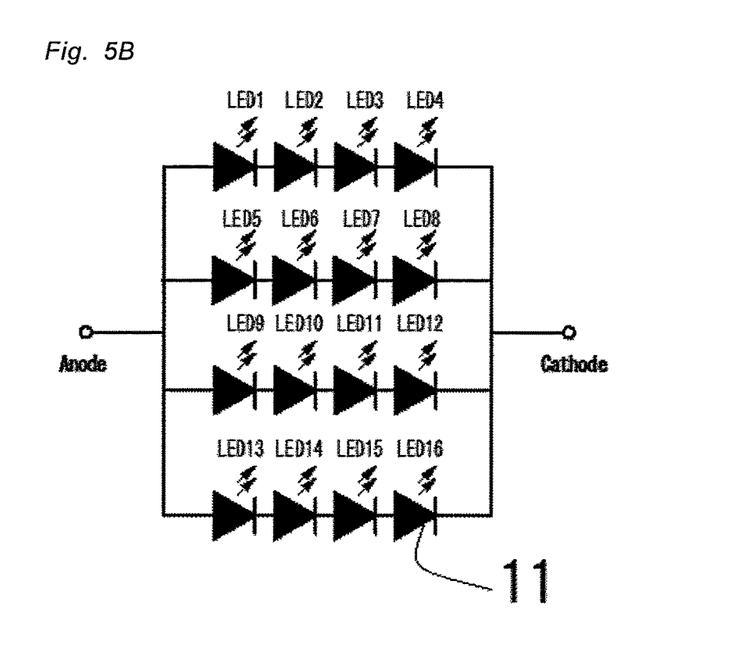
FIG. 5B is a circuit diagram showing the structure of the light emitting module according to an embodiment of the present disclosure.

FIGS. 5A and 5B show an example of such light emitting element groups. In this example, as shown in FIG. 5A, the light guiding plate 1 is divided into 16 pieces of regions R in 4 columns×4 rows. In each region R, 16 pieces of light emitting elements are arranged in a 4-column×4-row matrix. The 16 pieces of light emitting elements are, for example, electrically connected to each other in a four-parallel and four-series circuit such as shown in FIG. 5B.

The light emitting module 100 according to the present embodiment may be used as the backlight of one liquid crystal display device 1000. Further, the plurality of light emitting modules 100 may be arranged and used as the backlight of one liquid crystal display device 1000. Fabricating a plurality of light emitting modules 100 being small in size and subjecting each of the light emitting modules 100 to inspection or the like, yields improve as compared to the case where the light emitting module 100 is fabricated with a greater number of light emitting elements 11.

One light emitting module 100 may be bonded to one wiring board 20. Further, a plurality of light emitting modules 100 may be bonded to one wiring board 20. Thus, electrical connection terminals for external connection (e.g., a connector 20e) can be unified (that is, it is not necessary to provide an electrical connection terminal for each light emitting module) and, accordingly, the simplified structure of the liquid crystal display device 1000 is obtained.

Further, a plurality of wiring boards 20 in each of which the plurality of light emitting modules 100 is bonded may be arranged, to serve as the backlight of one liquid crystal display device 1000. Here, for example, a plurality of wiring boards 20 may be mounted on a frame or the like, and connected to an external poser supply using the connector 20e or the like.

Figure 6:
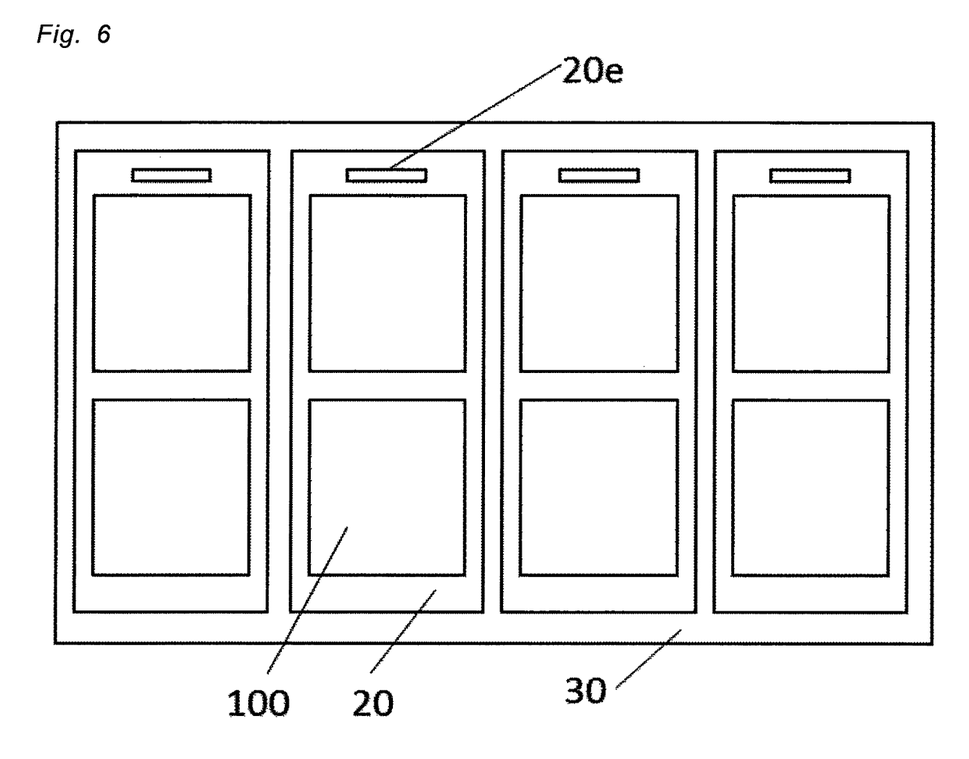
FIG. 6 is a schematic plan view of the light emitting module according to an embodiment of the present disclosure applied to a liquid crystal display device.

FIG. 6 shows an example of a liquid crystal display device including such plurality of light emitting modules 100. In this example, what are mounted on a frame 30 are four wiring boards 20, to each of which two light emitting modules 100 are bonded and each provided with the connector 20e. That is, eight light emitting modules 100 are arranged by 2-row×4-column. In this manner, the backlight of a large-area liquid crystal display device is manufactured at low costs.

Note that, a light-transmissive member having a diffusing function or the like may be further layered on the light guiding plate 1. In this case, when each optical function part 1a is a depression, the light-transmissive member is provided so as to close the opening of the depression (that is, the portion close to the first main surface 1c of the light guiding plate 1) while preventing the depression from being filled with the light-transmissive member. Thus, an air layer is provided in the depression of each optical function part 1a, whereby light from each light emitting element 11 spreads in an excellent manner.

INDUSTRIAL APPLICABILITY

The light emitting module of the present disclosure can be used as, for example, the backlight of a liquid crystal display device.

DENOTATION OF REFERENCE NUMERALS 1000 liquid crystal display device
100 light emitting module
110a lens sheet
110b lens sheet
110c diffusing sheet
120 liquid crystal panel
light guiding plate
1a optical function part
1b recess
1c first main surface of light guiding plate
1d second main surface of light guiding plate
11 light emitting element
11b electrodes of light emitting element
11c first main surface of light emitting element
11d second main surface of light emitting element
12 wavelength conversion part (positioning part)
13 sealing member
14 light-transmissive bonding member
15 wiring
20 wiring board
20a base member of wiring board
20b wiring layer of wiring board
20c conductive member of wiring board
20e connector
30 frame

What is claimed is:

1. A method of manufacturing a light emitting module, sequentially comprising:
   providing a light guiding plate having a first main surface being a light emitting surface, and a second main surface on a side opposite to the first main surface;
   disposing a plurality of light-transmissive bonding members on the second main surface of the light guiding plate;
   providing a plurality of light emitting elements on the light guiding plate;
   then providing a light-reflecting member so as to seal the plurality of light emitting elements and the second main surface of the light guiding plate in a manner that the light-reflecting member comes into contact with lateral surfaces of the light emitting elements and lateral surfaces of the light-transmissive bonding members at an external side of the second main surface of the light guiding plate in a section view; and
   forming a wiring electrically connecting the plurality of light emitting elements, wherein
   in the providing the plurality of light emitting elements, the plurality of light emitting elements are disposed on a light-transmissive bonding member disposed on the second main surface of the light guiding plate, and the light-transmissive bonding member covers the lateral surfaces of each light emitting element so as to spread toward the light guiding plate in the section view.

2. The method of manufacturing a light emitting module according to claim 1, wherein, in the providing the light guiding plate, a plurality of recesses are formed at the second main surface of the light guiding plate, and a wavelength conversion material is disposed at the plurality of recesses to form a plurality of wavelength conversion parts.

3. The method of manufacturing a light emitting module according to claim 1, wherein the light guiding plate has, on the first main surface side, optical function parts at positions opposing to the light emitting elements.

4. The method of manufacturing a light emitting module according to claim 3, wherein, recesses and the optical function parts are simultaneously formed with a molding assembly in forming the light guiding plate.

5. The method of manufacturing a light emitting module according to claim 1, wherein the plurality of light emitting elements is two-dimensionally arranged at the second main surface of the light guiding plate.

6. A light emitting module comprising:
   a light guiding plate having a first main surface and a second main surface;
   a plurality of wavelength conversion parts disposed at the second main surface of the light guiding plate so as to be spaced apart from each other;
   a plurality of light-transmissive bonding members;
   a plurality of light emitting elements respectively bonded to the plurality of wavelength conversion parts;
   a light-reflecting member sealing the plurality of light emitting elements and the second main surface of the light guiding plate in a manner that the light-reflecting member comes into contact with lateral surfaces of the light emitting elements and lateral surfaces of the light-transmissive bonding members at an external side of the second main surface of the light guiding plate in a section view; and
   a wiring connected to the plurality of light emitting elements,
   wherein each of the plurality of light emitting elements is bonded to one of the plurality of wavelength conversion parts via one of the plurality of light-transmissive bonding members, and
   wherein the light-transmissive bonding member covers the lateral surfaces of each light emitting element so as to spread toward the light guiding plate in the section view.

7. The light emitting module according to one of claim 6, wherein the second main surface of the light guiding plate has a plurality of recesses, and the plurality of wavelength conversion parts are respectively provided at the plurality of recesses.

8. The light emitting module according to claim 6, wherein the light guiding plate has, on the first main surface side, a plurality of optical function parts at positions opposing to the light emitting elements.

9. The light emitting module according to claim 6, wherein the plurality of wavelength conversion parts and the plurality of light emitting elements are two-dimensionally arranged at the second main surface of the light guiding plate.

10. A light emitting module comprising:
a light guiding plate having a first main surface and a second main surface;
a plurality of wavelength conversion parts disposed at the second main surface of the light guiding plate so as to be spaced apart from each other;
a plurality of light-transmissive bonding members;
a plurality of light emitting elements;
a light-reflecting member sealing the plurality of light emitting elements and the second main surface of the light guiding plate in a manner that the light-reflecting member comes into contact with lateral surfaces of the light emitting elements and lateral surfaces of the light-transmissive bonding members at an external side of the second main surface of the light guiding plate in a section view; and
a wiring connected to the plurality of light emitting elements,
wherein each of the plurality of light emitting elements is bonded to the light guiding plate via one of the plurality of light-transmissive bonding members, and
wherein the light-transmissive bonding member covers the lateral surfaces of each light emitting element so as to spread toward the light guiding plate in the section view.

* * * * *